(12) United States Patent
Bruneau et al.

(10) Patent No.: US 6,445,216 B1
(45) Date of Patent: Sep. 3, 2002

(54) SENSE AMPLIFIER HAVING REDUCED VT MISMATCH IN INPUT MATCHED DIFFERENTIAL PAIR

(75) Inventors: David W. Bruneau, Milwaukie; Siva G. Narendra; Vivek K. De, both of Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/855,910

(22) Filed: May 14, 2001

(51) Int. Cl.[7] .............................. G11C 7/06; G05F 1/10
(52) U.S. Cl. .......................... 327/52; 327/55; 327/537
(58) Field of Search ........................... 327/51–57, 534, 327/535, 537; 365/207, 205

(56) References Cited

U.S. PATENT DOCUMENTS

| | | | |
|---|---|---|---|
| 4,247,791 A | * 1/1981 | Rovell | 327/52 |
| 5,177,586 A | 1/1993 | Ishimura et al. | 365/189.05 |
| 5,502,680 A | * 3/1996 | Du et al. | 365/205 |
| 5,650,971 A | * 7/1997 | Longway et al. | 327/51 |
| 6,052,020 A | 4/2000 | Doyle | 327/539 |
| 6,140,877 A | 10/2000 | Forbes | 330/258 |
| 6,218,892 B1 | * 4/2001 | Soumyanath et al. | 327/537 |
| 6,222,395 B1 | * 4/2001 | Bertin et al. | 327/534 |

* cited by examiner

Primary Examiner—Toan Tran
(74) Attorney, Agent, or Firm—Blakely, Sokoloff, Taylor & Zafman LLP (57) ABSTRACT

A sense amplifier in which its output nodes provide a full voltage swing between the supply and return nodes. The sense amplifier further includes a reset circuit to selectively equalize the first and second output nodes. An output of the sense amplifier is coupled to either a digital logic gate or a flip-flop to receive the full swing. Each field effect transistor (FET) of the input pair in the sense amplifier is either zero body biased or forward body biased, so that a bulk-source junction of each FET is either zero biased or forward biased.

12 Claims, 6 Drawing Sheets

SENSE AMPLIFIER HAVING REDUCED VT MISMATCH IN INPUT MATCHED DIFFERENTIAL PAIR

BACKGROUND

This invention is generally related to sense amplifiers and more particularly to techniques for improving their sensitivity.

Sense amplifiers are used in digital solid state integrated circuit (IC) applications which require low voltage sensing. They can be used in memory read circuits for memory bit sensing, in bus signal receivers, and for interfacing low voltage data paths in a processor. Typically, the sense amplifiers are formed in the same IC die as the memory storage array and the processor data paths, using digital logic fabrication processes such as complimentary metal oxide semiconductor (CMOS). Although its inputs may be considered to be analog, the outputs of a sense amplifier are full swing voltages that are digital, i.e. one of only two stable DC levels which are essentially that of the power supply and power return node voltages.

A conventional CMOS sense amplifier at its input has a source coupled matched differential pair, an active load such as a regenerative circuit to provide a full swing, and a current sink or source. As the dimensions of the constituent field effect transistors (FETs) of the input pair decrease, it has been observed that variations in the threshold voltage Vt of the input FETs among different manufactured units have increased. This leads to increased offset voltages in the input pair and the active load, which reduces the sensitivity of the sense amplifier.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

Reducing Vt mismatch in the input matched differential pair of a sense amplifier improves its sensitivity by lowering the input offset. According to the various embodiments of the invention described below, this reduction in Vt mismatch is accomplished by either applying a zero voltage bias or a small forward bias to the source-bulk p-n junction of each FET in the input matched differential pair. An additional benefit of the improvement in sensitivity is that the sense amplifier can be enabled earlier in time to detect an increasing input voltage. This means that use of the improved sense amplifier in a solid state memory read circuit, or in other applications which require a large number of consecutive sensing operations, may yield faster processing of large amounts of data.

Figure 1:
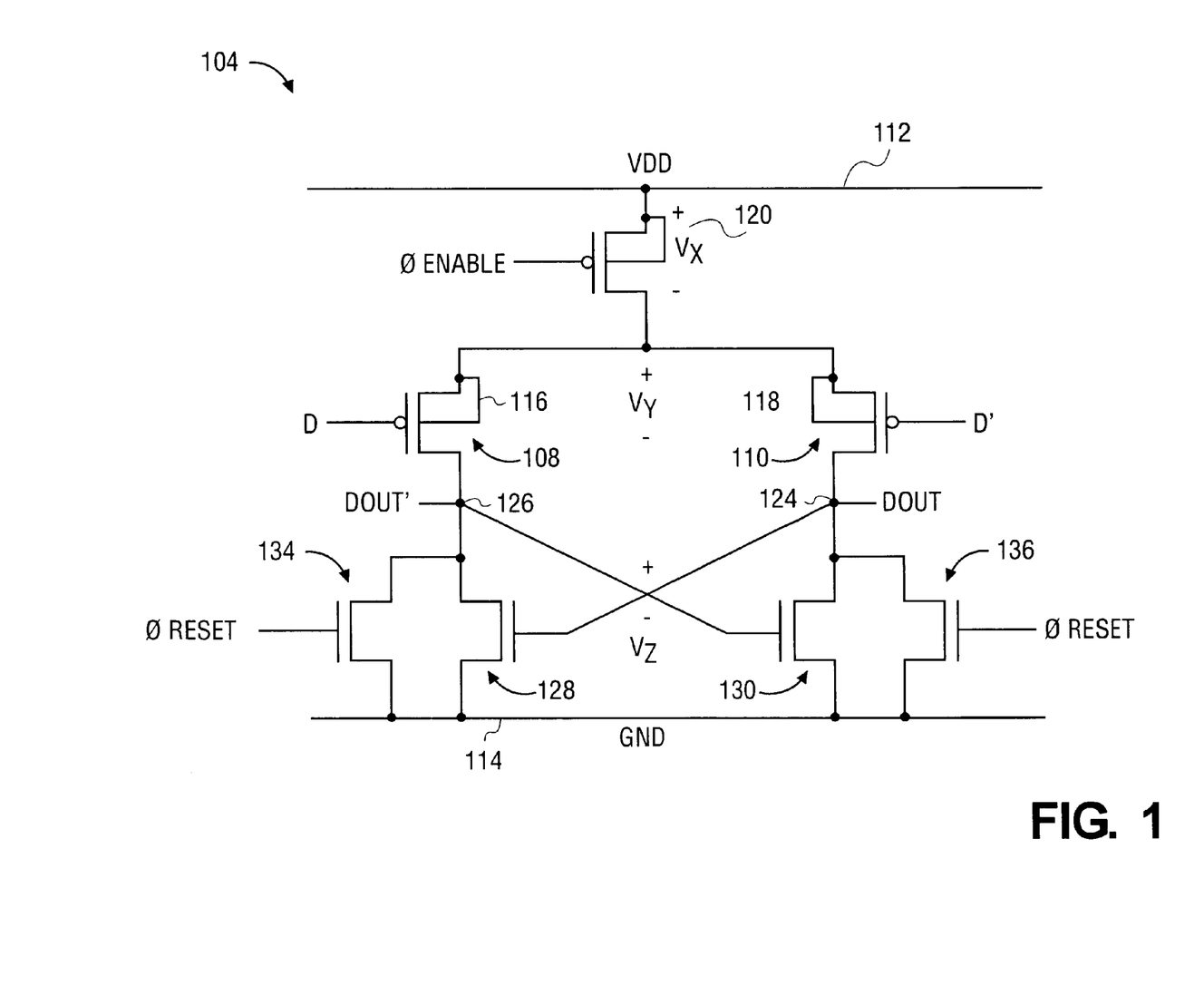
FIG. 1 shows a circuit schematic of a sense amplifier having a zero voltage bias to the source-bulk p-n junction of each FET in the input matched differential pair.

The sense amplifier 104 illustrated in FIG. 1 is based on an input matched differential field effect transistor (FET) pair of devices 108 and 110. These two devices are source coupled between a power supply node 112 (at a voltage labeled VDD) and a power return node 114 (at a voltage labeled GND). Each FET 108, 110 of the input pair has gate, drain, source, and bulk regions, where the bulk regions are contacted by terminals 116 and 118. As can be seen, the bulk and source terminals of each FET 108, 110 of the input matched pair are shorted to each other. This means that a bulk-source p-n junction of each FET 108, 110 is zero voltage biased. As will be explained below using FIG. 4, the zero voltage bias helps reduce Vt mismatch in the FETs 108, 110.

Figure 2:
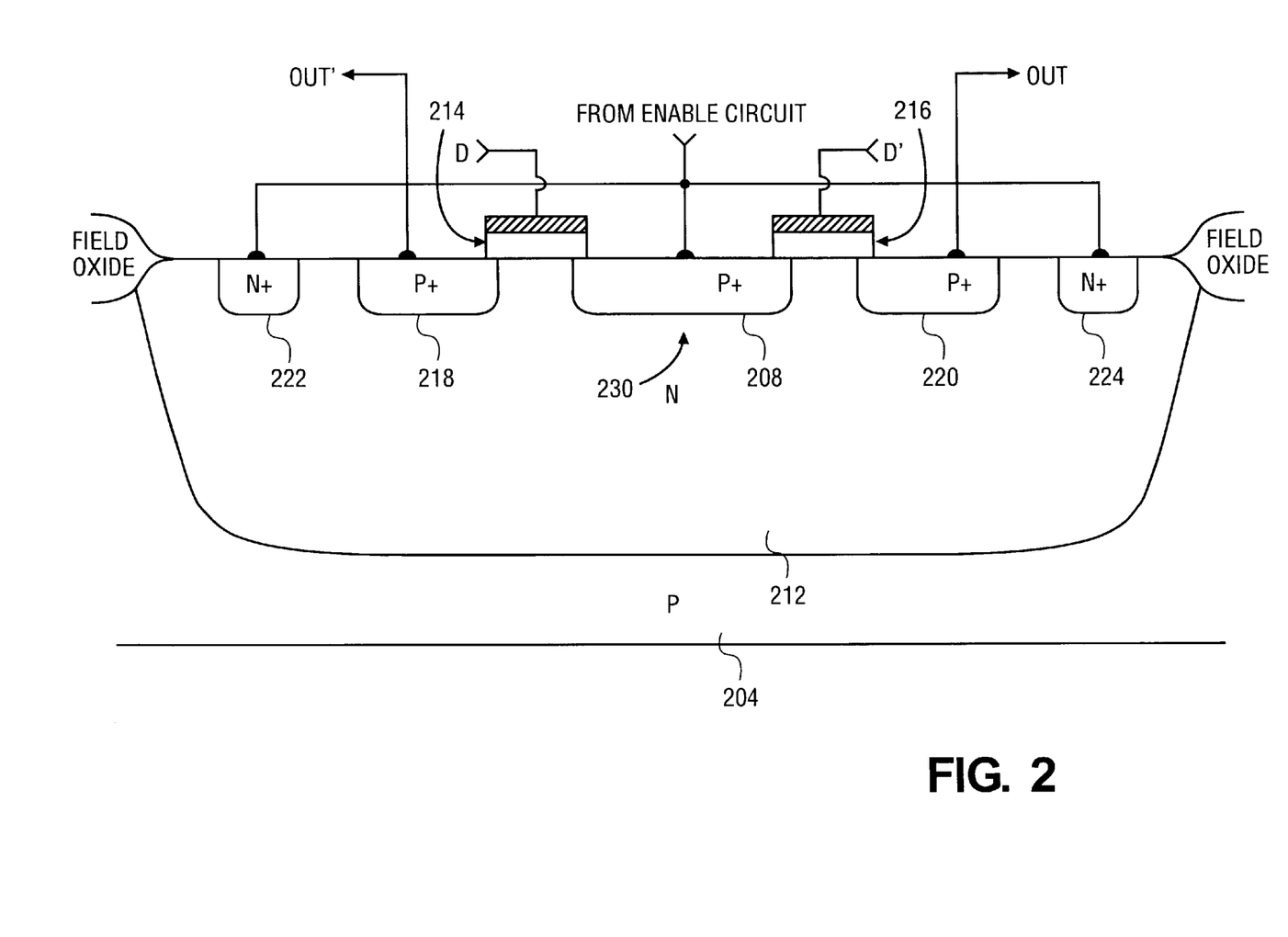
FIG. 2 depicts a cross-section view of a matched differential FET pair.

The input pair 108, 110 is matched in the sense that the two devices are replicates designed to have closely matching physical characteristics such as channel length and width. In addition, the two devices are positioned very close to each other in the IC die. For instance, a matched pair may be obtained by having a single highly doped p-type diffusion being shared by the source regions of the two devices. The regions for the source and drains of the input matched pair may be built in an n-well region of a p-type semiconductor substrate. A cross section of such a matched pair is shown in FIG. 2. The matched pair in FIG. 2 is built in a p-type substrate 204. A shared diffusion 208 is formed in an n-well region 212 formed in the substrate 204. A metal contact from the shared diffusion 208 receives current from an enable circuit (not shown in FIG. 2). Two gate regions 214 and 216 are formed on opposite sides of the shared diffusion 208. The gate contacts receive the input signals D and D'. The outputs of the matched pair are provided at nodes that are contacting the drain regions 218 and 220. In one embodiment, the conductors that contact these drain regions are also the output nodes for the DOUT' and DOUT signals. As one alternative, an output amplification stage may be connected to the drain regions 218, 220 to further amplify the input signals. Finally, the bulk or body regions 222 and 224 are electrically shorted to the shared diffusion 208 as shown.

Other topologies for the input matched pair are possible in which the bulk and source regions of each FET of the input pair are shorted so that a bulk-source junction of each FET is zero voltage biased. For instance, there may be a topology in which each FET of the matched pair has a separate source region, rather than the shared diffusion region 208 shown in FIG. 2. For the exemplary topology of FIG. 2, the bulk-source junction is indicated by the reference number 230.

Returning to FIG. 1, the sense amplifier 104 further includes an enable circuit 120 that is coupled between the source regions of the input matched pair 108, 110 and, in this embodiment, the supply node 112. The enable circuit selectively enables the sense amplifier by being switched on to conduct current from the supply node to the source regions of the input matched pair 108, 110. Control of the enable circuit 120 is accomplished by an externally supplied control signal PHI enable. As an alternative to the enable circuit 120, a continuously running bias circuit may be provided between the source regions of the input matched pair 108, 110 and the supply node 112, if power consumption is less of a concern in the overall system.

The sense amplifier 104 has first and second output nodes 124 and 126 that provide complimentary voltage signals that are to be driven in opposite directions by the input pair 108, 110. Each output node 126 or 124 is to provide a full voltage swing, that is essentially "rail to rail" or from supply line to return line. This is accomplished using a full voltage swing circuit which, in the embodiment shown in FIG. 1, is a cross coupled pair of n-channel FETs (NFETs) 128 and 130. This cross coupled NFET pair 128,130 ensures that the output voltages DOUT and DOUT' take on only one of two stable dc voltages, one that is essentially at VDD and the other essentially at GND. This is also referred to as a full voltage swing, where the upper voltage limit is at VDD−Vx−Vy (where Vx is, as shown in FIG. 1, the drop across the enable circuit 120 and Vy is the drop across the input pair 108, 110.) The lower limit of the full voltage swing is Vz which is the voltage drop across the cross coupled NFET pair 128, 130.

Finally, the sense amplifier 104 further includes a reset circuit which in this embodiment is implemented by a pair of switching NFETs 134, 136. The reset circuit helps keep the output DOUT, DOUT' of the sense amplifier 104 at a predetermined, initial level until the sense amplifier is to amplify the difference between the input signals D, D'. This controllable reset feature is needed due to the regeneratively driven output nodes 124, 126. The reset circuit is coupled to selectively equalize the first and second output nodes 124, 126, in response to an externally supplied control signal PHI reset. In the embodiment shown in FIG. 1 when PHI reset is asserted, the DOUT and DOUT' are equalized to GND. As an alternative, the reset circuit may equalize the output nodes to another predetermined dc level, such as VDD.

The output nodes 124, 126 of the sense amplifier 104 provide their full swing to the input of a digital logic gate or a flip-flop (not shown in FIG. 1). This connection to a logic gate or a flip-flop may be single ended in that only one of the two output nodes 124, 126 provides the input to the logic gate or flip-flop. This logic gate or flip-flop in turn provides only one of two stable dc voltages at its output, in response to either DOUT or DOUT' from the sense amplifier 104.

Figure 3:
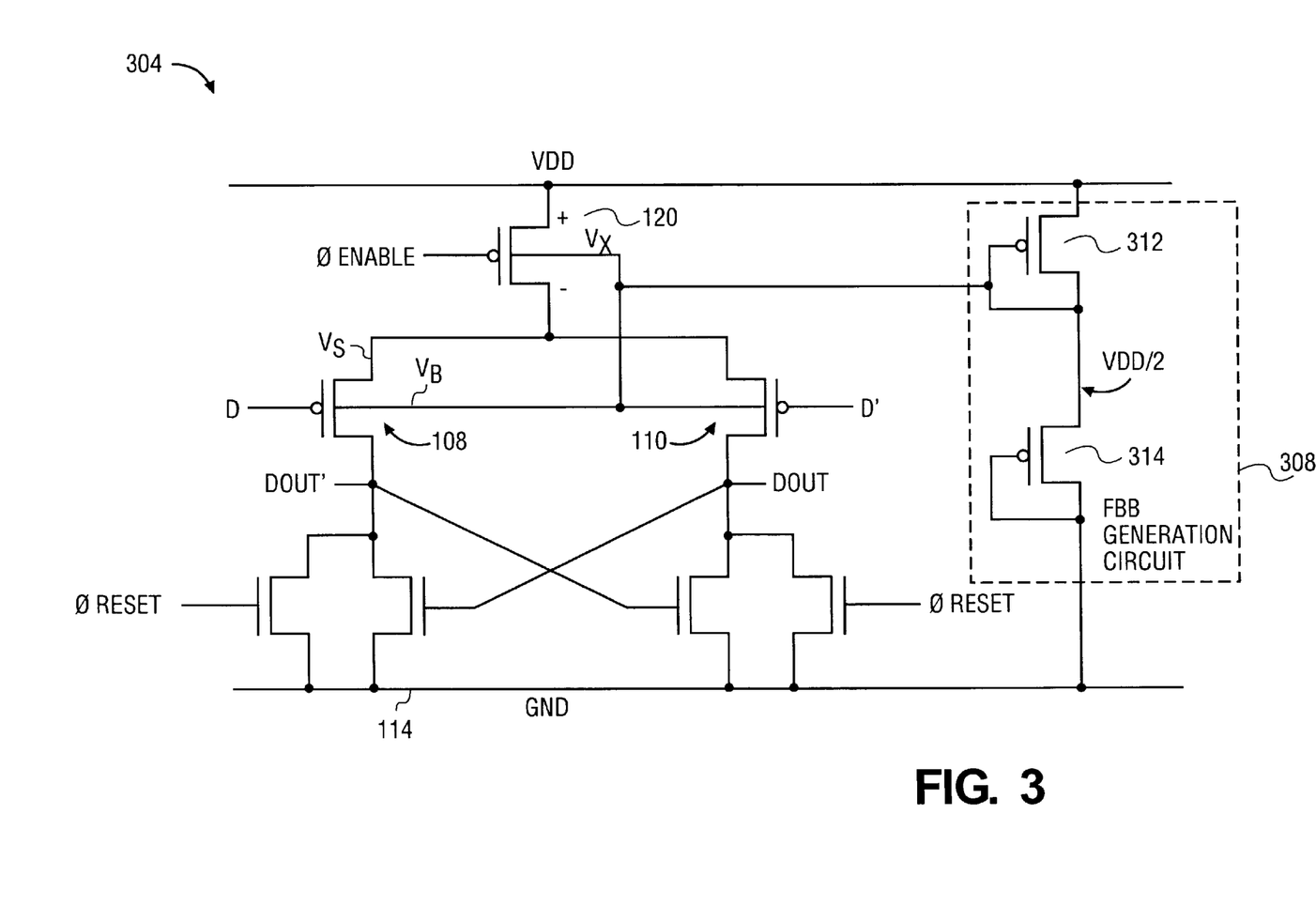
FIG. 3 shows a circuit schematic of a sense amplifier having a small forward body bias applied to the input matched pair.

FIG. 3 shows a circuit schematic of a sense amplifier 304 which advantageously features a further reduction in the variation of the threshold voltage Vt of the input matched pair 108, 110. In this embodiment, the sense amplifier 304 may be essentially identical to 104 of FIG. 1, except that the bulk-source junction of each FET of the input matched pair 108, 110 is slightly forward biased. Whereas zero voltage body bias to each FET means that the difference between the bulk voltage Vb and the source voltage Vs is zero volts, a forward body bias (FBB) on the p-channel FET (PFET) devices 108, 110 means that Vb<Vs. To accomplish this forward body bias, FIG. 3 shows an exemplary forward body bias (FBB) generation circuit 308 which is in essence a voltage divider having a pair of stacked diode connected PFETs 312 and 314. The forward body bias is defined in this case to be Vs−Vb=Vdd−Vx−Vdd/2=Vdd/2−Vx. For operation in a conventional temperature range, this forward body bias should be less than 0.7 volts and preferably around 400–500 mV. Accordingly, if Vx is assumed to be approximately 0.1 volts, than this particular voltage divider based FBB generation circuit 308 is useful only if VDD is <1.6 volts. For larger values of VDD, the FBB generation circuit 308 should be modified, as one of ordinary skill in the art would be capable of doing, to not exceed the maximum allowable forward body bias to the PFETs 108, 110 in view of the operating temperature.

Although FIG. 3 shows that the enable circuit has a PFET 120 which also receives the forward body bias, this may not help reduce the Vt mismatch in the PFETs 108, 110 of the input pair. The forward body bias on the enable circuit 120 will, however, help increase switching speed of the enable circuit due to the lower threshold voltage Vt obtained for the PFET 120.

Figure 4:
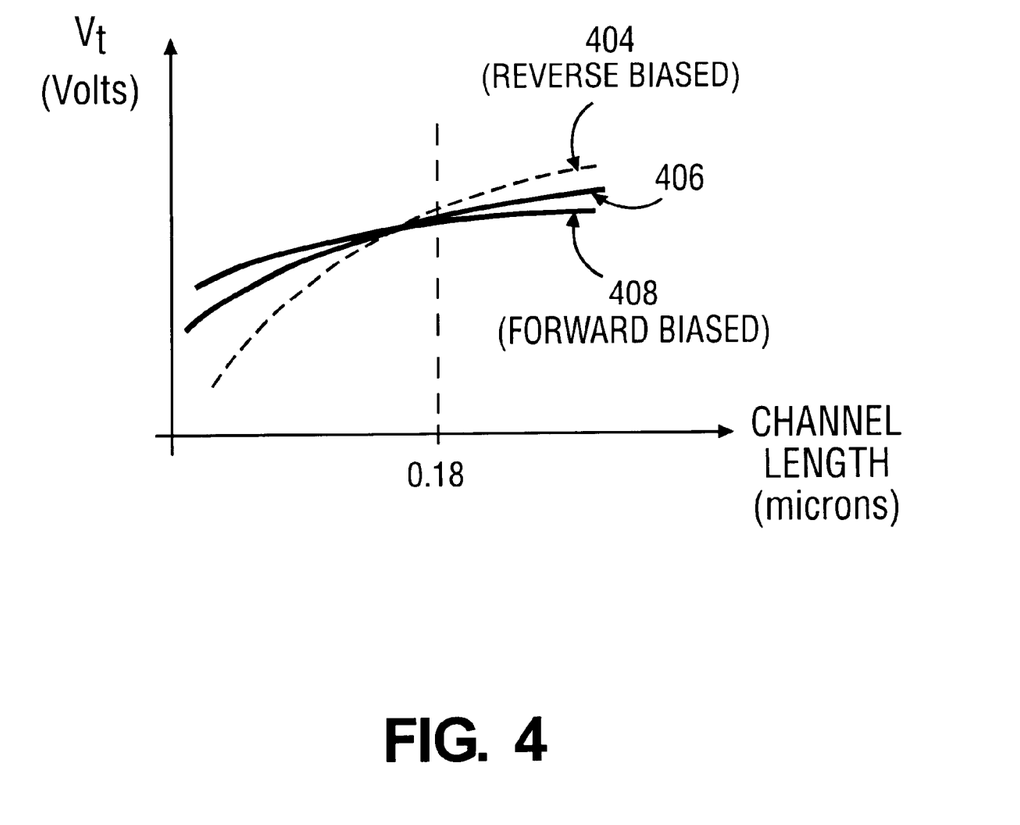
FIG. 4 illustrates the variation in threshold voltage Vt as a function of channel length in a FET.

The plot in FIG. 4 helps illustrate the benefits of applying a zero or a slight forward bias to the source-bulk junction in each FET of the input matched pair of a sense amplifier. The application of zero or slight forward bias in this case helps reduce the variation in the threshold voltage Vt of each FET, as a function of manufacturing process variations. The plots in FIG. 4 show the variation in Vt as a function of the channel length in a FET. The plot 404 shows the variation in Vt as a function of channel length for a reverse body biased FET, while plot 408 shows the variation in Vt for a forward body biased FET. Note how the slope of each plot increases as channel length is reduced. This means that for short channel length devices, the variation in Vt is higher than for longer channel length devices. However, the plot 404 is much steeper than the plot 408. Thus, the variation in Vt for the reverse biased FET is much higher than that of the forward body biased FET. A plot for the zero body biased FET is expected to lie between 404 and 408, in that the slope of that plot would be probably greater than that of the plot 408 but less than 404. The plot for the zero body biased FET is given by the line 406. Accordingly, the application of a zero body bias or a forward body bias to the input matched differential pair serves to further reduce the variation in Vt that is exhibited in manufactured versions of the sense amplifiers shown in FIGS. 1 and 3, as evidenced by the smaller slopes of the plots 406 and 408. This reduction in the variation of Vt helps further reduce Vt mismatch between the FETs of the input matched pair, beyond any reduction in mismatch that can be obtained by conventional device size and layout matching techniques. Such an additional reduction in Vt mismatch is particularly desirable in sense amplifiers that have very small channel length devices on the order of 0.18 microns and less.

Figure 5:
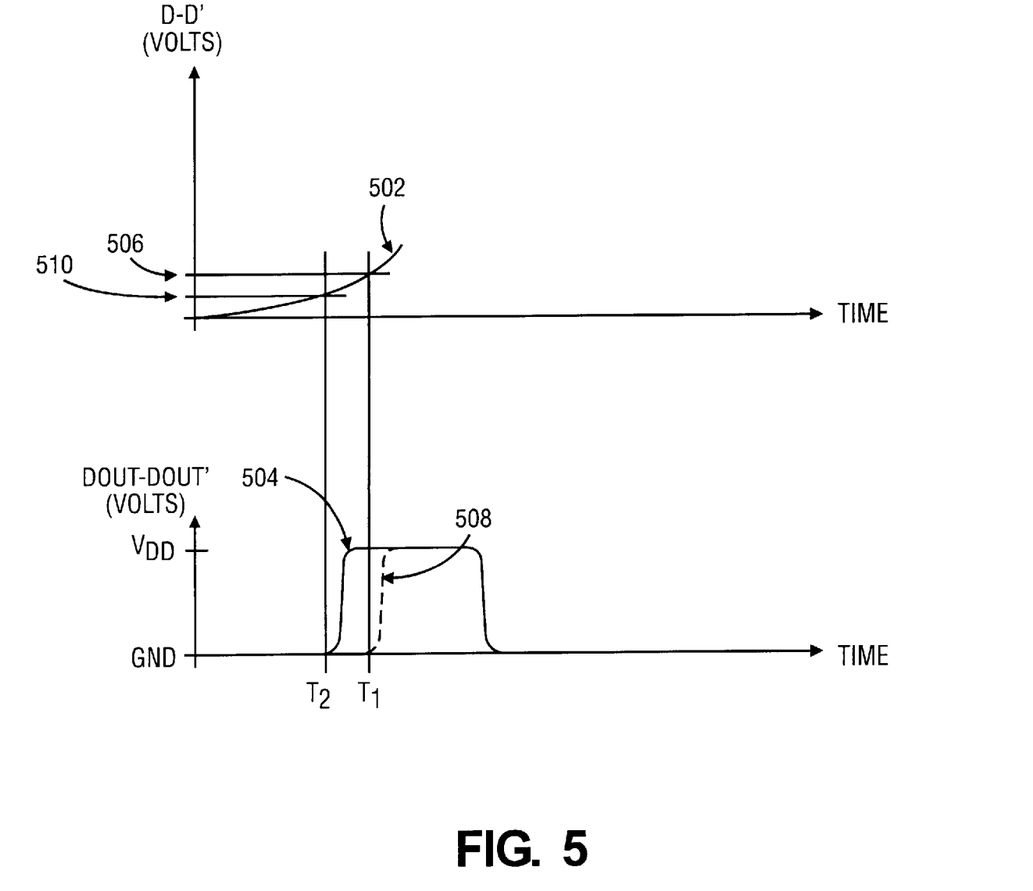
FIG. 5 illustrates a plot of input and output voltage waveforms to the sense amplifier.

The effect of a reduction in Vt mismatch in the sense amplifiers 104 and 304 results in an improvement in sensitivity of the sense amplifier. This means that the sense amplifier is able to resolve, that is determine a difference between, input voltages that are smaller than if the source-bulk junction of each FET were reverse biased. This is illustrated in the plots of FIG. 5 which show an increasing input voltage plot 502 (for D–D') and the resulting output plot 504 (for DOUT–DOUT') of the improved sense amplifier. A method for operating the sense amplifier may be described as follows. Prior to time t2, the sense amplifier is kept reset, such that its output DOUT–DOUT' is at a fixed, predetermined level, (here, GND). As the input signal D–D' increases to just above the level 510, a time t2 has been reached at which time the reset is disabled, such that the sense amplifier correctly detects the direction of the difference at its input, and the output begins to move upwards towards the power supply voltage (here, VDD). In contrast, had the FETs of the input matched pair of the sense amplifier been reverse biased, rather than zero body biased or forward body biased, there would be no guarantee that the sense amplifier would correctly detect the input difference. That's because of the increased input offset that would have been present at the input matched pair, due to the increased Vt mismatch when the FETs of the input pair are reverse biased. Thus, if the FETs of the input matched pair were reverse body biased, then the reset would have to be disabled later in time, say time t1, so as to accurately resolve the input signal D–D' with the higher offset voltage of the input matched pair. The plot 508 and the larger input voltage level 506 show this lower performance by the sense amplifier having reverse body biased FETs in the input matched pair.

A further advantage of the use of zero body bias or forward body bias on the input matched pair of a sense amplifier is apparent from the plots in FIG. 5 in that the reset of the sense amplifier can be disabled earlier in time, namely by the difference t1–t2, than if the source-bulk junction were reverse biased. This means that the sense amplifier can transition faster from one read cycle to the next, thus yielding faster sensing over consecutive read cycles.

Figure 6:
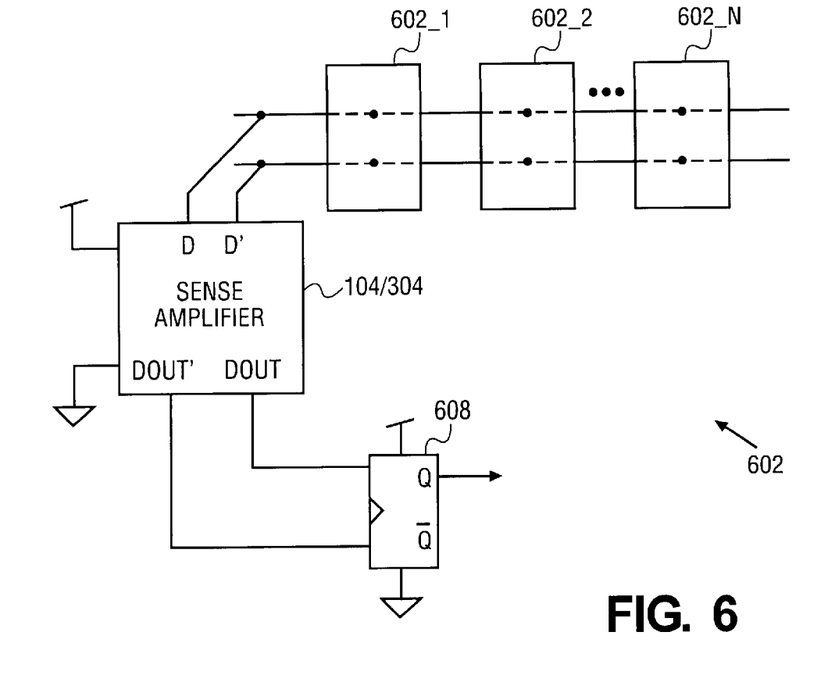
FIG. 6 shows a block diagram of a portion of a processor integrated circuit die having the sense amplifier coupled to a low voltage data path of the processor.

FIG. 6 shows a block diagram of a portion of a processor integrated circuit die 602 having a sense amplifier coupled to a low voltage data path of the processor. The voltage path is differential in that two conductors side by side are provided, and where a number of logic functional units 602_1, 602_2, . . . 602_N are tapping into the low voltage differential data path. An example of the logic functional units may be high performance adders and multipliers. The sense amplifier 104/304 is coupled between a power supply node and a power return node and provides its output signals, as digital differential full swing signals, to the inputs of a flip-flop 608. The output of the flip-flop 608, be it the Q or Q', is also digital full swing, such that only one of two stable dc voltages are provided.

Figure 7:
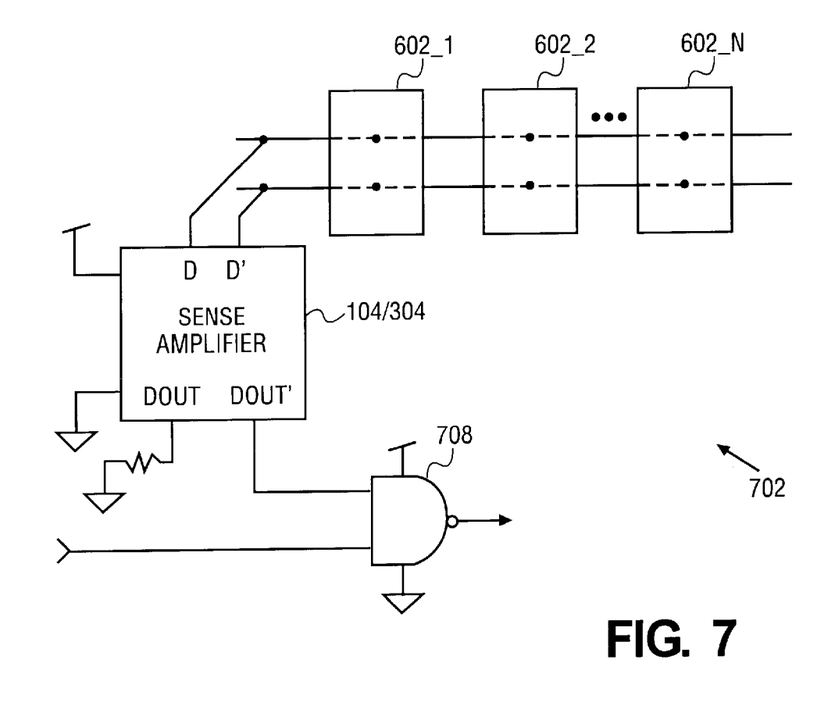
FIG. 7 shows another version of the processor in which an output of the sense amplifier directly feeds a logic gate of the processor.

In FIG. 7, another version of the processor is shown in which only one of the two outputs of the sense amplifier are being used, where this output is directly feeding one input of a dual input NAND gate 708. One of ordinary skill in the art will recognize that other applications of the sense amplifier in digital logic circuits are possible, including its use as a memory read circuit in a solid state memory device such as a dynamic random access memory (DRAM) die.

To summarize, various embodiments of the invention have been described that are directed to an improved sense amplifier featuring zero or forward body biasing of the FETs in its input matched differential pair. In the foregoing specification, the invention has been described with reference to specific exemplary embodiments thereof. It will, however, be evident that various modifications and changes may be made thereto without departing from the broader spirit and scope of the invention as set forth in the appended claims. For instance, one of ordinary skill in the art will recognize that a complimentary version of the sense amplifier 104/304 described above is possible, such that the input matched pair are NFETs. The specification and drawings are, accordingly, to be regarded in an illustrative rather than a restrictive sense.

What is claimed is:

1. A circuit comprising:
   a sense amplifier having (1) an input matched differential p-channel field effect transistor (FET) pair source coupled between a power supply node and a power return node, each FET of the input pair having gate, drain, source, and bulk regions, (2) first and second output nodes whose voltages are to be driven in opposite directions by the input pair, each output node to provide a full voltage swing between the supply and return nodes, (3) a reset circuit coupled to selectively equalize the first and second output nodes, and (4) a p-channel switching field effect transistor coupled in series between a common source of the pair and the power supply node;
   one of a digital logic gate and a latch, having an input coupled to receive the full swing and in response provide at an output one of only two stable DC voltages; and
   forward body bias (FBB) generation circuit coupled to the bulk region of each FET of the input pair and of the switching FET in the sense amplifier.

2. The circuit of claim 1 wherein the sense amplifier further includes a cross-coupled FET pair coupled between the first and second output nodes and the return node to regeneratively provide the full swing.

3. The circuit of claim 1 wherein the input pair and the switching FET are formed in the same n-well.

4. The circuit of claim 2 wherein the sense amplifier and the digital logic gate and the latch are built using an n-well complimentary metal oxide semiconductor (CMOS) fabrication process.

5. A processor integrated circuit die comprising:
   an on-chip low voltage data path having a signal conductor;
   on-chip full swing logic circuitry; and
   an on-chip interface between the low voltage data path and the full swing logic circuitry, the interface includes a sense amplifier that has (1) an input matched differential p-channel field effect transistor (FET) pair source coupled between a power supply node and a power return node, each FET of the input pair having gate, drain, source, and bulk regions, (2) first and second output nodes whose voltages are to be driven in opposite directions by the input pair, each output node to provide a full voltage swing between the supply and return nodes, (3) a reset circuit coupled to selectively equalize the first and second output nodes and (4) a p-channel switching field effect transistor coupled in series between a common source of the pair and the power supply node, and forward body bias (FBB) generation circuit coupled to the bulk region of each FET of the input pair and of the switching FET in the sense amplifier.

6. The processor die of claim 5 wherein the sense amplifier further includes a cross-coupled FET pair coupled between the first and second output nodes and the return node to regeneratively provide the full swing.

7. The processor die of claim 5 wherein the input pair and the switching FET are formed in the same n-well.

8. The processor die of claim 6 wherein all the on-chip data path, full swing logic circuitry, and interface are built using an n-well complimentary metal oxide semiconductor (CMOS) fabrication process.

9. A method comprising:
   removing a reset condition in a sense amplifier, which allows the amplifier to detect an increasing input voltage, the sense amplifier having (1) an input matched differential p-channel field effect transistor (FET) pair source coupled between a power supply node and a power return node, each FET of the input pair having gate, drain, source, and bulk regions, (2) first and second output nodes whose voltages are to be driven in opposite directions by the input pair, each output node to provide a full voltage swing between the supply and return nodes, (3) a reset circuit coupled to selectively equalize the first and second output nodes, and (4) a pchannel switching field effect transistor coupled in series between a common source of the pair and the power supply node; and then
   disabling the sense amplifier after the first or second output voltage has reached the full swing,
   wherein a bulk-source junction of each FET of the input differential pair and of the switching FET in the sense amplifier is forward biased so that the sense amplifier can be enabled earlier in time than if the source-bulk junction were reverse-biased, to detect a smaller input voltage.

10. The method of claim 9 further comprising:
applying the reset condition in the sense amplifier, by equalizing the first and second output nodes of the sense amplifier.

11. The method of claim 9 wherein the disabling of the sense amplifier includes cutting off current to source regions of the input pair.

12. The method of claim 9 further comprising:
regeneratively driving the first and second output nodes of the sense amplifier after the reset condition has been removed, in response to detecting the increasing input voltage.

* * * * *